United States Patent
Kwon et al.

(10) Patent No.: US 7,479,667 B2
(45) Date of Patent: Jan. 20, 2009

(54) SEMICONDUCTOR DEVICE WITH MODIFIED MOBILITY AND THIN FILM TRANSISTOR HAVING THE SAME

(75) Inventors: Jang-yeon Kwon, Gyeonggi-do (KR); Takashi Noguchi, Gyeonggi-do (KR); Young-soo Park, Gyeonggi-do (KR); Do-young Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1 day.

(21) Appl. No.: 11/022,756

(22) Filed: Dec. 28, 2004

(65) Prior Publication Data
US 2005/0139923 A1 Jun. 30, 2005

(30) Foreign Application Priority Data
Dec. 30, 2003 (KR) .............. 10-2003-0100494

(51) Int. Cl.
*H01L 29/76* (2006.01)
*H01L 29/745* (2006.01)

(52) U.S. Cl. .............. 257/213; 257/52; 257/63

(58) Field of Classification Search .......... 257/52, 257/55, 63, 64, 53, 221, 344, 335, 336, 404, 257/548, 550, 213
See application file for complete search history.

(56) References Cited

U.S. PATENT DOCUMENTS

| | | | |
|---|---|---|---|
| 5,461,250 A * | 10/1995 | Burghartz et al. | 257/347 |
| 5,696,011 A * | 12/1997 | Yamazaki et al. | 438/166 |
| 5,981,974 A | 11/1999 | Makita | |
| 6,232,622 B1 | 5/2001 | Hamada | |
| 6,322,625 B2 | 11/2001 | Im | |
| 6,906,346 B2 * | 6/2005 | Nishitani et al. | 257/70 |
| 2002/0036289 A1 * | 3/2002 | Tamura et al. | 257/64 |
| 2002/0125480 A1 | 9/2002 | Nakamura et al. | |
| 2003/0049892 A1 | 3/2003 | Yamaguchi et al. | |
| 2004/0248386 A1 | 12/2004 | Nishitani et al. | |
| 2005/0059223 A1 * | 3/2005 | Im | 438/487 |

FOREIGN PATENT DOCUMENTS

| | | |
|---|---|---|
| EP | 0 801 427 A2 | 10/1997 |
| EP | 0801427 A2 * | 10/1997 |

(Continued)

OTHER PUBLICATIONS

European Search Report issued in EP 04 25 7956 on Sep. 14, 2006 by the European Patent Office Berlin, Germany.

(Continued)

*Primary Examiner*—Monica Lewis
(74) *Attorney, Agent, or Firm*—Buchanan Ingersoll & Rooney PC (57) ABSTRACT

Provided are a semiconductor device including an active area which is defined as high and low mobility areas and a thin film transistor having the semiconductor device. The mobility of the active area can be lowered to a level enough to satisfy the requirement of the semiconductor device. The lowering of the mobility of the active area can contribute to reducing mobility deviation between semiconductor devices. As a result, the quality of a flat panel display adopting a large-scale semiconductor device can be greatly improved.

7 Claims, 7 Drawing Sheets

FOREIGN PATENT DOCUMENTS

WO 02/09192 A1 1/2002

OTHER PUBLICATIONS

Jeon, Jae-Hong, et al., *"A New Poly-Si TFT with Selectively Doped Channel Fabricated by Novel Excimer Laser Annealing"*, International Electron Devices Meeting 2000. Technical Digest. San Francisco, California, Dec. 10-13, 2000, pp. 213-216, IEEE, New York, NY.

Wang, Albert W., *"A Strategy for Modeling of Variations due to Grain Size in Polycrystalline Thin-Film Transistors"*, May 2000, pp. 1035-1043, vol. 47., No. 5, IEEE Transactions on Electron Devices, IEEE Service Center, Piscataway, NJ.

* cited by examiner

SEMICONDUCTOR DEVICE WITH MODIFIED MOBILITY AND THIN FILM TRANSISTOR HAVING THE SAME

BACKGROUND OF THE INVENTION

Priority is claimed to Korean Patent Application No. 10-2003-0100494, filed on Dec. 30, 2003, in the Korean Intellectual Property Office, the disclosure of which is incorporated herein in its entirety by reference.

1. Field of the Invention

The present invention relates to a polycrystalline silicon device and a thin film transistor (TFT) having the same, and more particularly, to a polycrystalline silicon device with uniform mobility and a TFT having the same.

2. Description of the Related Art

Polycrystalline silicon (poly-Si) has higher mobility and better light stability than amorphous silicon. Such poly-Si is used widely in various application fields, particularly, in TFTs or memory devices. A poly-Si TFT is used, for example, as a switching device of a display. Examples of a display device using an active element such as a TFT include a TFT-liquid crystal display (LCD), a TFT-organic light emitting diode (OLED), or the like.

The TFT-LCD or the TFT-OLED has a structure in which a TFT is disposed on each pixel among pixels arranged on an X-Y matrix. The performance of an LCD, an OLED, or the like in which a plurality of TFTs are arranged greatly depends on the electric characteristics of the TFTs. One of major characteristics a TFT requires is higher mobility of a Si active layer. Crystallization is necessary for increasing the mobility of the Si active layer. The development of poly-Si approaching single crystalline is one of the important study tasks to crystalline silicon. U.S. Pat. No. 6,322,625 discloses a method of manufacturing high-quality silicon crystalline. Many studies on the crystallization of silicon have contributed to obtaining a crystalline structure approaching single crystalline.

However, the improvement of the uniformity of polycrystalline is a problem to be still solved and a subject to be presently studied. For example, in a case of the TFT-OLED, desired mobility is 5 to 30 $cm^2/Vs$, which is satisfied with a technique for manufacturing poly-Si capable of realizing the mobility of about 100 $cm^2/Vs$.

However, the uniformity of mobility is less than several percentages, while according to the results of present studies, the mobility is about 80 to 20 $cm^2Ns$, and thus the mobility deviation is about 20%. The mobility deviation of this degree deteriorates the quality of a display device.

SUMMARY OF THE INVENTION

The present invention provides a high-quality semiconductor device formed by improving the uniformity of silicon crystalline with an array structure and a TFT having the high-quality semiconductor device.

According to an aspect of the present invention, there is provided a semiconductor device including a silicon-based active area including high and low mobility areas over an electron mobility path.

According to another aspect of the present invention, there is provided a thin film transistor including: a Si-based channel; source and drain which are formed beside both sides of the Si-based channel; a gate which applies an electric field to the Si-based channel; and an insulating layer which is interposed between the active area and the gate. Here, the Si-based channel includes high and low mobility areas over an electron mobility path.

In the semiconductor device and the thin film transistor having the semiconductor device, a plurality of at least one of the high and low mobility areas may be provided. It is preferable that the low mobility area is formed in the center of the high mobility area.

According to an aspect of the present invention, the high mobility area may have a polycrystalline structure, and the low mobility area may have an amorphous structure.

According to another aspect of the present invention, the high mobility area may have a polycrystalline structure, and the low mobility area may have a micro polycrystalline structure.

According to still another aspect of the present invention, the high mobility area may have a SiGe crystalline structure, and the low mobility area may have a single crystalline structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A Si semiconductor device, according to the present invention, and a TFT having the Si semiconductor device will be described in detail with reference to the attached drawings.

Figure 1:
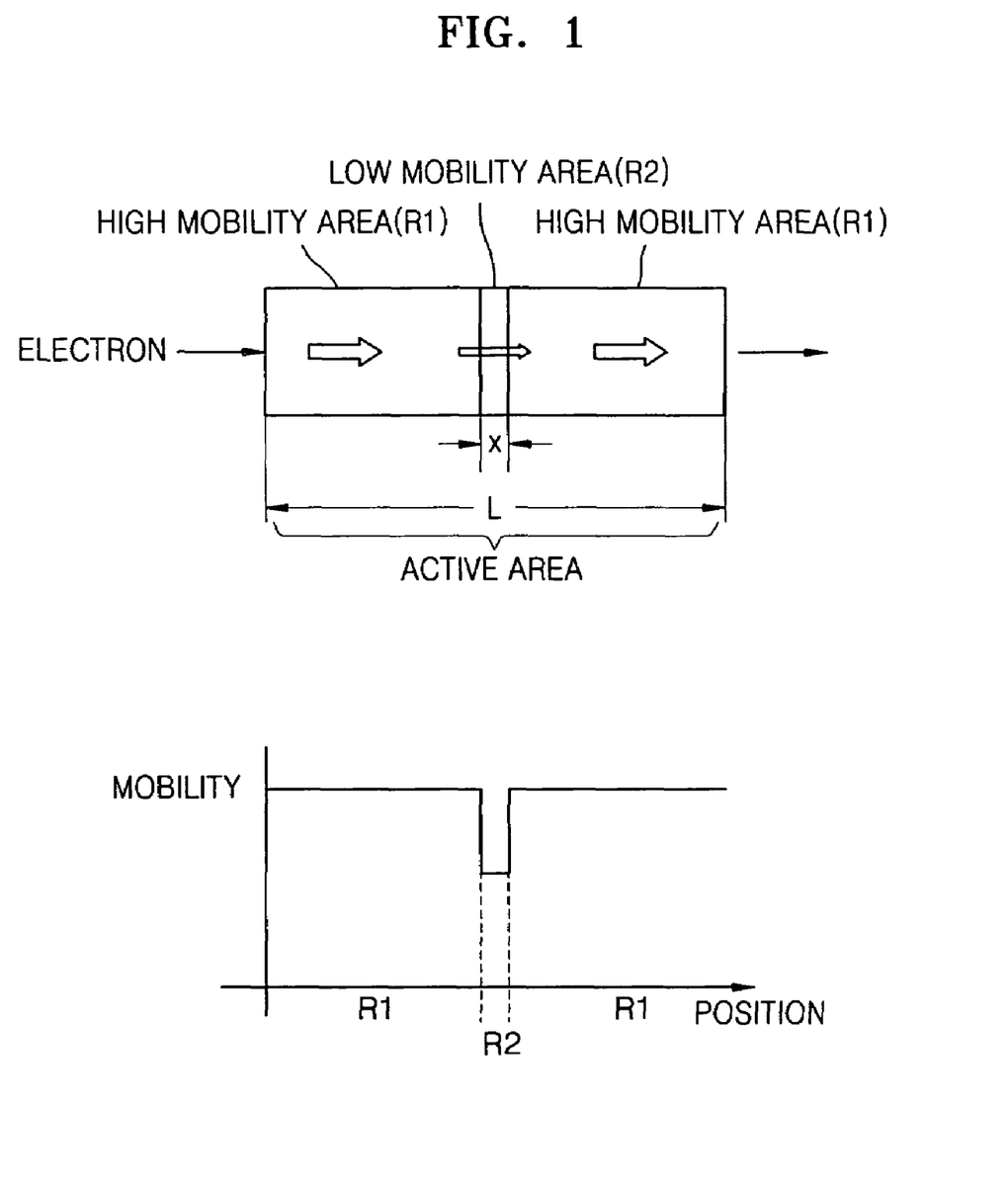
FIG. 1 is a view for explaining an active area of a semiconductor device, according to embodiments of the present invention.

FIG. 1 is a view for explaining a technical concept of a Si semiconductor device, according to the present invention. As shown in FIG. 1, the Si semiconductor device of the present invention has a structure in which high and low mobility areas R1 and R2 are formed in an active area that is an electron mobility channel having a predetermined length L. In other words, a channel of a Si semiconductor device includes an active area through which electrons flow. The active area includes a high mobility area which is formed of poly-Si having high mobility and a low mobility area which is formed of amorphous silicon (a-Si) having a predetermined length x. Here, the Si semiconductor device according to an embodiment of the present invention may be the above-described channel or a device including the channel.

In other words, in embodiments of the present invention, the active area is maintained by poly-Si having high mobility, and a low mobility area is formed of a-Si in a portion of an area over the channel through which electrons flow. Thus, the active area of the present invention has lower mobility and lower mobility deviation than an active area formed of only poly-Si.

Figure 2:
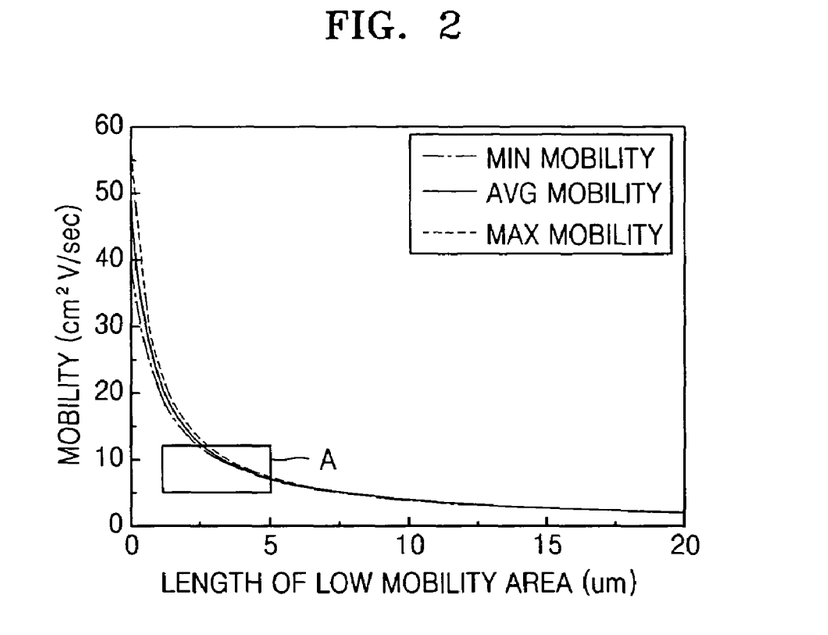
FIG. 2 is a graph for showing variations of the mobility of the active area with respect to variations of the length of a low mobility area in semiconductor embodiments of the present invention.

FIG. 2 is a graph for showing variations of the (average, maximum, and minimum) mobility of the entire active area having a fixed length L with respect to variations of the length of the low mobility area R2, i.e., variations of a ratio of the length of the low mobility area R2 to the length of the high mobility area R1.

As shown in FIG. 2, as the length of the low mobility area R2 increases, the variation of the mobility of the entire active area is small and particularly, the deviation of the mobility of the entire active area is reduced. For example, when x=0, i.e., when the active area formed of poly-Si is prepared without the low mobility area R2, the mobility of the active area is about 50 cm$^2$/Vs and the mobility deviation of the active area reaches 20%. From the graph of FIG. 2, the central curved line denotes average mobility, the upper curved line denotes maximum mobility, and the lower curved line denotes minimum mobility. When the length x of the low mobility area R2 increases, the mobility of the active area sharply decreases. When the length x of the low mobility area R2 is 3 to 5 μm, the variation of the mobility of the active area is reduced. The mobility deviation of the active area is greatly reduced and then stabilized due to a reduction in a difference between maximum and minimum mobilities. For example, when the width of the low mobility area R2 is calculated to be 3.1 μm, the mobility of the active area is 10 cm$^2$/Vs and the mobility deviation of the active area is reduced to about 3.6%.

Figure 3:
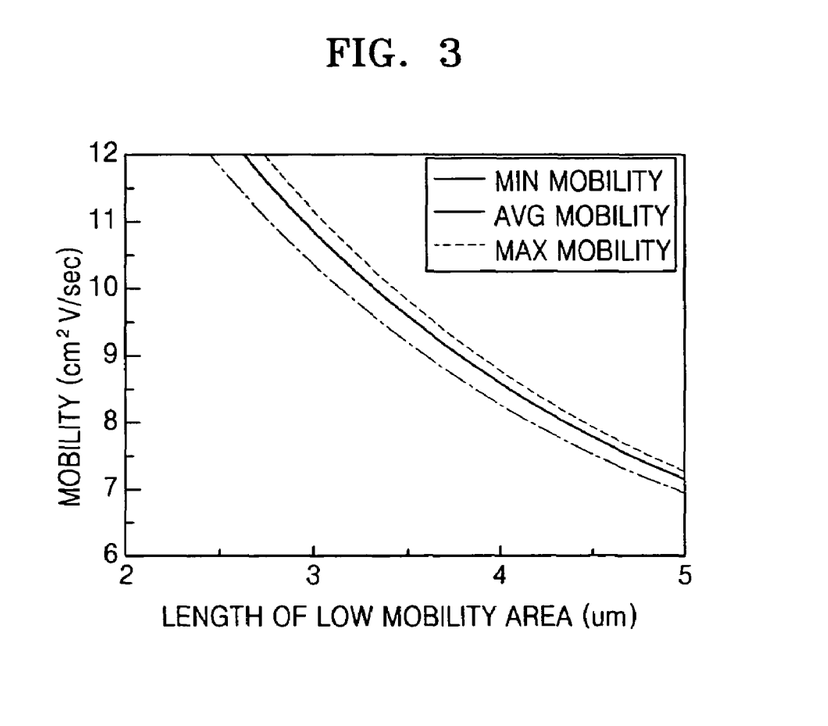
FIG. 3 is an enlarged graph of portion A of FIG. 2.

FIG. 3 is an enlarged graph of portion A of FIG. 2. Here, the deviation among the average, maximum, and minimum mobilities is reduced with an increase in the width of the low mobility area R2.

As described above, according to the present invention, poly-Si has very high mobility, i.e., high mobility of 100 cm$^2$/Vs enough to be applied to any kinds of devices which have been developed. In other words, although the mobility of poly-Si is reduced to less than a predetermined level, the mobility of poly-Si is sufficient to be applied to any kinds of devices. For example, in a case of an OLED requiring the mobility of about 5 to 30 cm$^2$/Vs, even though the mobility of the OLED is lowered to about 30 cm$^2$/Vs, the quality of the OLED remains unchanged. Thus, in the present invention, the mobility is lowered so as not to cause the performance of a device to be poor. The lowered mobility reduces the mobility deviation, which increases the uniformity of the mobilities of a plurality of semiconductor devices manufactured at the same time. In other words, in the present invention, in order to lower the mobility, a high mobility area is formed of poly-Si and a low mobility area is formed of a-Si having partially low mobility.

Figure 4:
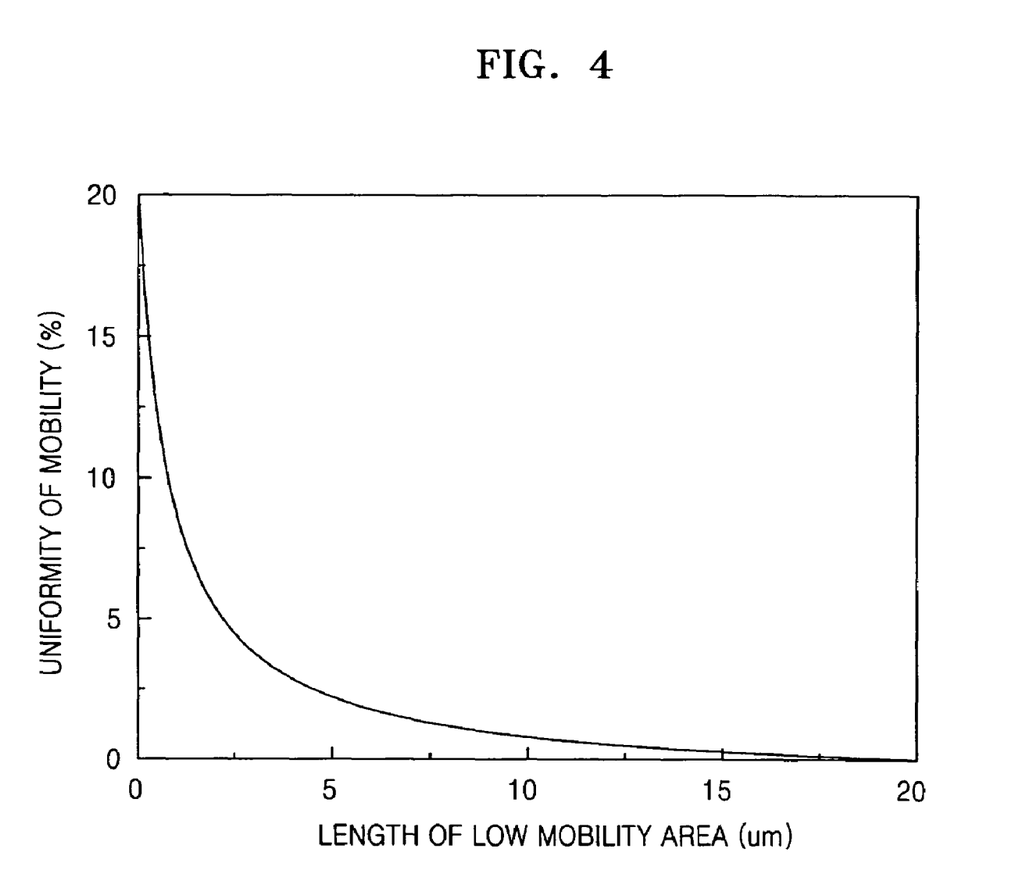
FIG. 4 is a graph for showing variations of mobility deviation with respect to variations of the length of a low mobility area in semiconductor embodiments of the present invention.

FIG. 4 is a graph for showing variations of mobility deviation during manufacturing of a semiconductor device having the active area of the present invention. In other words, FIG. 4 shows variations of the mobility deviation with respect to variations of the length of a low mobility area when a high mobility area has the mobility of 40 to 60 cm$^2$/Vs and the low mobility area has the mobility of about 0.5 cm$^2$/Vs. As can be seen in FIG. 4, the mobility deviation decreases with an increase in the length of the low mobility area. In particular, the mobility deviation is greatly reduced and thus stabilized when the length of the low mobility area is more than 3 to 5 μm.

Accordingly, the semiconductor device of the present invention includes a high mobility area which occupies most of an area over a path through which electrodes move and a low mobility area which lies in the center of the high mobility area, so as to lower the mobility of the electrons. The high and low mobility areas may be modified into various forms different from those of FIG. 1.

Figure 5A:
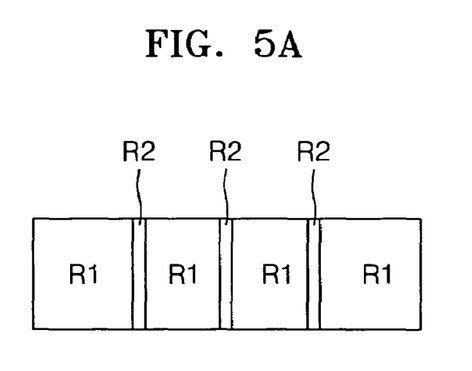
FIGS. 5A through 5D are views for showing various patterns of the active area of the semiconductor device of the present invention.

According to an aspect of the present invention, as shown in FIG. 5A, the active area of the semiconductor device of the present invention has a structure in which a plurality of high mobility areas R1 and a plurality of low mobility areas R2 are alternately arranged.

Figure 5B:
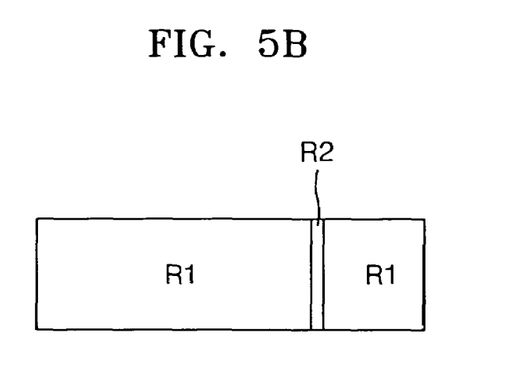

According to another aspect of the present invention, as shown in FIG. 5B, the active area of the semiconductor device of embodiments of the present invention has a structure in which a low mobility area R2 is interposed between high mobility areas R1 having different lengths.

Figure 5C:
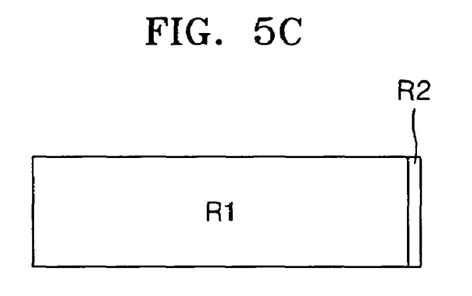

According to still another aspect of the present invention, as shown in FIG. 5C, the active area of the semiconductor device of embodiments of the present invention has a structure in which one low mobility area R2 is disposed at an end of one high mobility area R1.

Figure 5D:
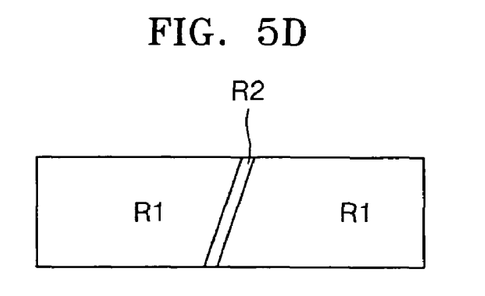

According to yet another aspect of the present invention, as shown in FIG. 5D, the active area of the semiconductor device of embodiments of the present invention has a structure in which one low mobility area R2 is slantingly disposed between high mobility areas R1.

Figure 6:
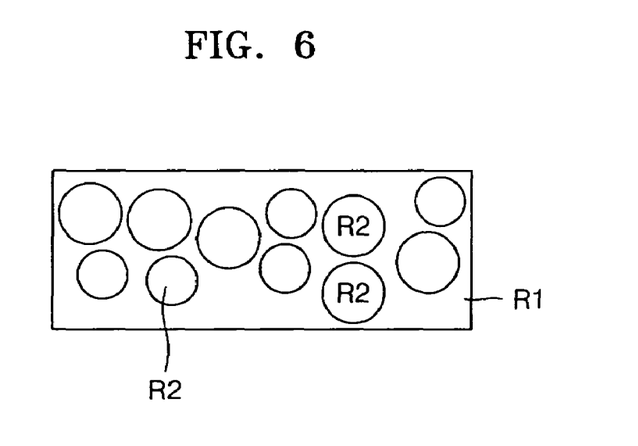
FIG. 6 is a view for showing another pattern of the active area of semiconductor embodiments of the present invention.

FIG. 6 is a view for showing another pattern of the active area of the semiconductor device of the present invention. Referring to FIG. 6, an entire active area is defined by a low mobility material, for example, a-Si or micro poly-Si (which denotes crystalline Si having smaller grain diameter than poly-Si and which is referred to as μ-Si). In the active area, a high mobility area R1 is formed of a high mobility material, for example, μ-Si or poly-Si, in an island shape. This is to allow electrons to pass through a high mobility material layer via a low mobility material layer.

Here, high and low mobility materials are selected depending on a difference in relative mobility. For example, when the low mobility material is a-Si, one of high mobility materials, for example, μ-Si and poly-Si, may be selected. When the low mobility material is μ-Si, poly-Si may be selected as the high mobility material. When the low mobility material is single crystalline Si, SiGe may be selected as the high mobility material. It is obvious that the active area may be formed of one of other materials that are not mentioned herein, and a semiconductor device including such an active area and an apparatus having the semiconductor device pertain to the technical scope of the present invention.

An active area having the above-described structure may be obtained using various methods.

Figure 7A:
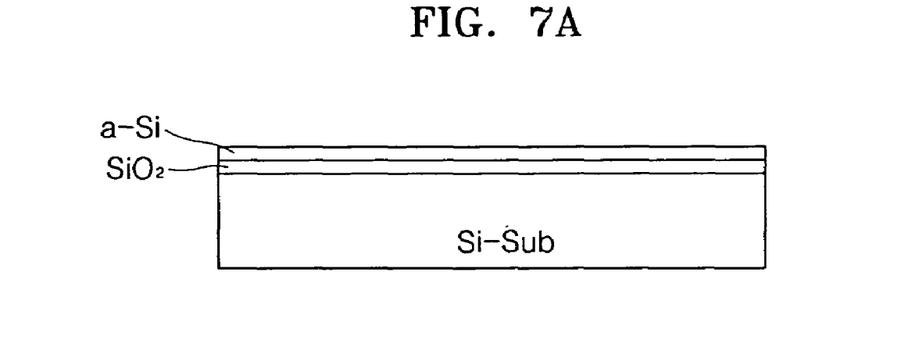
FIGS. 7A through 7C are cross-sectional views for explaining a method of manufacturing the active area of the semiconductor device, according to an embodiment of the present invention.

As shown in FIG. 7A, a-Si is deposited over a Si substrate on which SiO$_2$ has been formed, using plasma enhanced chemical vapor deposition (PECVD) or low pressure CVD (LPCVD).

Figure 7B:
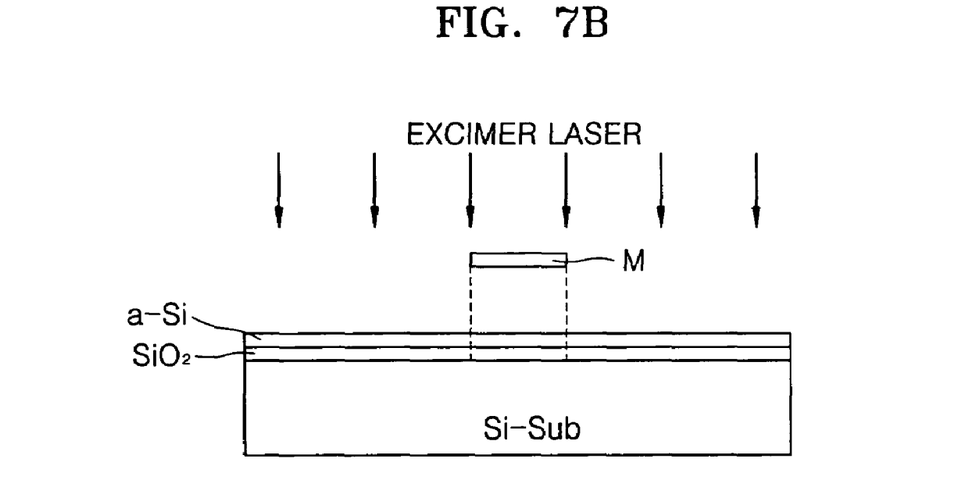
Figure 7C:
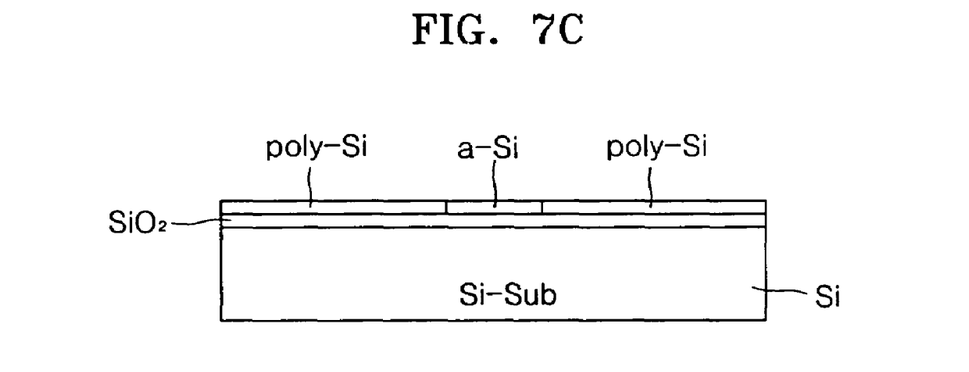

As shown in FIG. 7B, a portion, which is defined as a low mobility area, is covered with a mask M. Next, excimer laser is irradiated to crystallize a portion that is exposed to the excimer laser. As shown in FIG. 7C, such selective excimer laser annealing (ELA) contributes to obtaining an active area including a high mobility area formed of poly-Si and a low mobility area formed of a-Si.

Figure 8A:
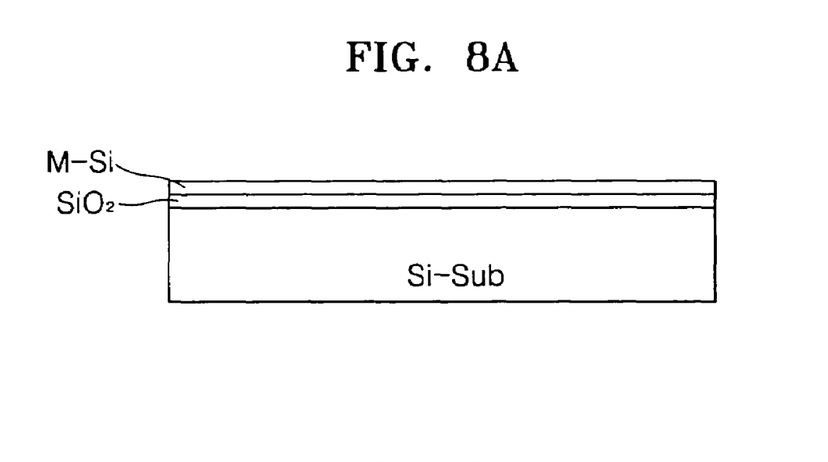
FIGS. 8A through 8C are cross-sectional views for explaining a method of manufacturing the active area of the semiconductor device of the present invention, according to another embodiment of the present invention.

As shown in FIG. 8A, μ-Si is deposited over a Si substrate on which SiO₂ has been formed, using catalytic (CAT)-CVD, inductively coupled plasma (ICP)-CVD, or ultra-high vacuum (UHV)-CVD.

Figure 8B:
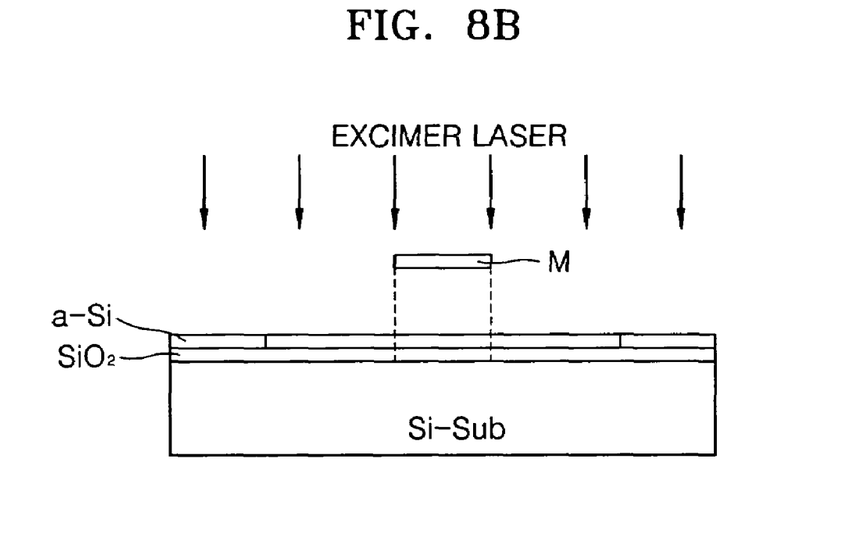
Figure 8C:
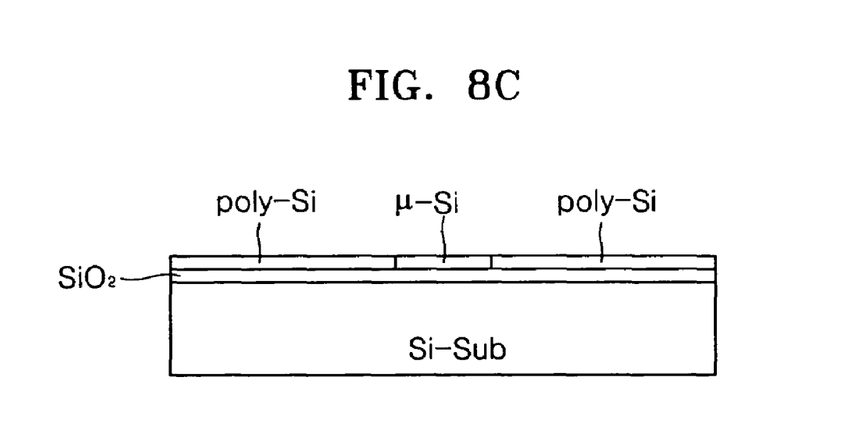

As shown in FIG. 8B, a portion, which is defined as a low mobility area, is covered with a mask M. Next, excimer laser is irradiated to re-crystallize a portion of μ-Si exposed to the excimer laser. As shown in FIG. 8C, such selective ELA contributes to obtaining an active area including a high mobility area formed of poly-Si and a low mobility area formed of μ-Si.

Processes of forming low and high mobility areas in an active area shown in FIGS. 7A through 7C and FIGS. 8A through 8C are performed during manufacturing of a TFT or a display device having the TFT and may be properly modified for a target semiconductor device.

The above-described processes are performed for each wafer. In other words, as is generally known, wafer is mounted on an X-Y stage, and then a plurality of channels having such an active area are formed at the same time by performing one-time process.

Figure 9:
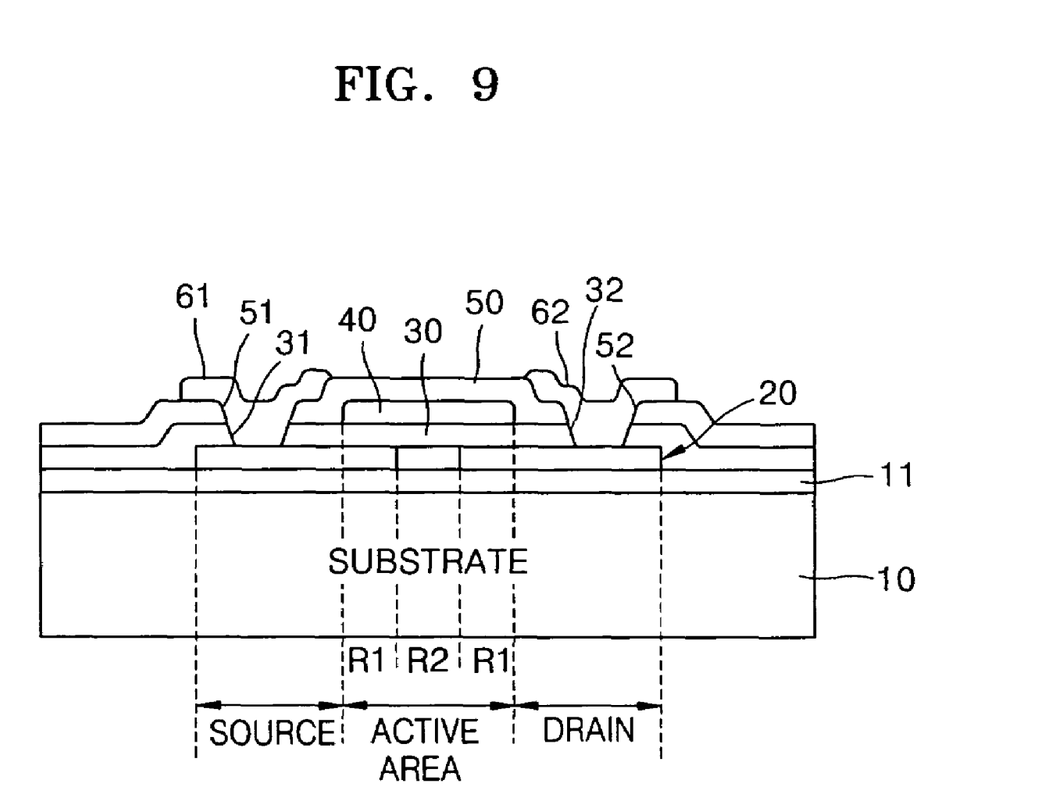
FIG. 9 is a schematic cross-sectional view of a TFT, according to an embodiment of the present invention.

FIG. 9 is a schematic cross-sectional view for showing a TFT, according to the present invention. Referring to FIG. 9, a silicon film 20 is formed over a substrate 10 on which a SiO₂ insulating layer 11 has been formed. A gate insulating layer 30 having contact holes 31 and 32 facing both ends of the silicon film 20 is formed on the silicon film 20. A gate 40 is formed on the central portion of the gate insulating layer 30 located between the contact holes 31 and 32. An intermetallic dielectric (IMD) layer 50 is formed on the gate 40. Contact holes 51 and 52 matching with the contact holes 31 and 32 are formed in the IMD layer 50. Source and drain electrodes 61 and 62 are formed on the contact holes 51 and 52 of the IMD layer 50 so as to be electrically connected to both ends of the silicon film 20.

Portions of the silicon film 20 contacting the source and drain electrodes 61 and 62 are doping areas having high conductivity, an area between the doping areas is an active area in which a field effect occurs due to the gate 40. As previously described, the active area includes a high mobility area R1 and a low mobility area R2. The active area of FIG. 9 has the structure of FIG. 1 in which the high mobility area R1 and the low mobility area R2 are disposed.

The active area may also have the structures of FIGS. 5 and 6. The active area is obtained from doping areas beside both sides thereof, i.e., source and drain, and one Si film. As is well known, the source and drain are highly doped areas. The active area located between the source and drain may be selectively crystallized so as to have high mobility or may be discriminately crystallized so as to locally vary mobility. Such selective or discriminative crystallization has been previously described and thus will not be explained herein.

Such a TFT may be widely used in a semiconductor memory device, a flat panel display (FPD), or the like. The above-described substrate may be formed of glass or plastic. Examples of a device using a substrate formed of plastic include a FPD, particularly, an organic light-emitting diode (OLED). In other words, the present invention is particularly suitable for an OLED.

The above-described TFT is a top gate type. However, in a case the above-described TFT includes an active area having such a structure, the TFT may be applied to a bottom gate type and thus may be easily realized based on the above-described contents.

As described above, in a semiconductor device with modified mobility and a TFT having the semiconductor device, according to the present invention, unnecessarily high mobility of an active area can be lowered so as to increase the uniformity of the mobility. High and low mobility areas can contribute to increasing the uniformity of the mobility. As a result, the quality of a device adopting the high and low mobility areas, for example, a FPD, an OLED, or the like, can be greatly improved.

The present invention can be applied to a silicon-based semiconductor device, i.e., any kinds of devices having an active area forming a channel using an electric field. In particular, the present invention can be widely used in the field of TFT. Thus, a representative target product is a FPD.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
a Si-based channel having an active area including at least two high mobility areas and at least one low mobility area along an electron mobility path of a thin film transistor, the two high mobility areas being separated by the low mobility area along the electron mobility path of the Si-based channel;
a source and a drain which are respectively formed on sides of the Si-based channel along the electron mobility path;
a gate for applying an electric field to the Si-based channel; and
an insulating layer interposed between the active area and the gate,
wherein said Si-based channel includes more than two high mobility areas and a plurality of low mobility areas.

2. The thin film transistor of claim 1, wherein the low mobility area is formed in the center of the high mobility areas.

3. The thin film transistor of claim 1, wherein the high mobility areas have a polycrystalline structure, and the low mobility area has an amorphous structure.

4. The thin film transistor of claim 1, wherein the high mobility areas have a polycrystalline structure, and the low mobility area has a micro polycrystalline structure.

5. The thin film transistor of claim 1, wherein the high mobility areas are formed of SiGe, and the low mobility area has a single crystalline structure.

6. The thin film transistor of claim 1, wherein the high mobility areas have a micro polycrystalline structure, and the low mobility area has an amorphous structure.

7. The thin film transistor of claim 1, wherein the high mobility areas have a substantially same thickness as the low mobility area in a direction normal to the electron mobility path.

* * * * *